United States Patent [19]

Foss et al.

[11] 4,367,420

[45] Jan. 4, 1983

[54] DYNAMIC LOGIC CIRCUITS OPERATING IN A DIFFERENTIAL MODE FOR ARRAY PROCESSING

[75] Inventors: Richard C. Foss; Philip M. Thompson, both of Ottawa, Canada

[73] Assignee: Thompson Foss Incorporated, Ottawa, Canada

[21] Appl. No.: 155,594

[22] Filed: Jun. 2, 1980

[51] Int. Cl.³ .................. H03K 19/096; H03K 19/21; H03K 19/017; G06F 7/52
[52] U.S. Cl. .................................. 307/453; 307/468; 307/471; 364/758
[58] Field of Search .................. 307/221 C, 448, 453, 307/468, 470, 471, 472, 481, 475, 530, 279; 364/758

[56] References Cited

U.S. PATENT DOCUMENTS

| | | | |
|---|---|---|---|
| 3,602,732 | 8/1971 | Suzuki | 307/471 |
| 3,965,460 | 6/1976 | Barbara | 307/481 X |
| 3,980,897 | 9/1976 | Arnold | 307/279 X |
| 3,993,919 | 11/1976 | Cox et al. | 307/468 X |
| 4,181,865 | 1/1980 | Kohyama | 307/279 X |
| 4,250,412 | 2/1981 | Kung et al. | 307/279 |
| 4,292,548 | 9/1981 | Suarez et al. | 307/448 X |

OTHER PUBLICATIONS

Lau et al., "Inverse Exclusive or Circuit for Dynamic Logic"; *IBM Technical Disclosure Bull.;* vol. 17, No. 6, pp. 1666–1667; 11/1974.

*Primary Examiner*—Larry N. Anagnos
*Attorney, Agent, or Firm*—Fleit & Jacobson

[57] ABSTRACT

The disclosure teaches various logic circuits operating with Dynamic Differential Logic (DDL). In a particular embodiment MOS transistors of n-channel type are used with circuits arranged to avoid any dc path from clock input to ground. The input capacitance of the active devices is used for temporary storage thereby reducing circuit complexities. Coupling between stages is provided by clock driven transistors connected so that the transistor at the higher voltage side cuts off early in the period of clock pulse decay, thereby isolating adjacent stages without unnecessary delay. The use of such circuits in array processors is described.

11 Claims, 14 Drawing Figures

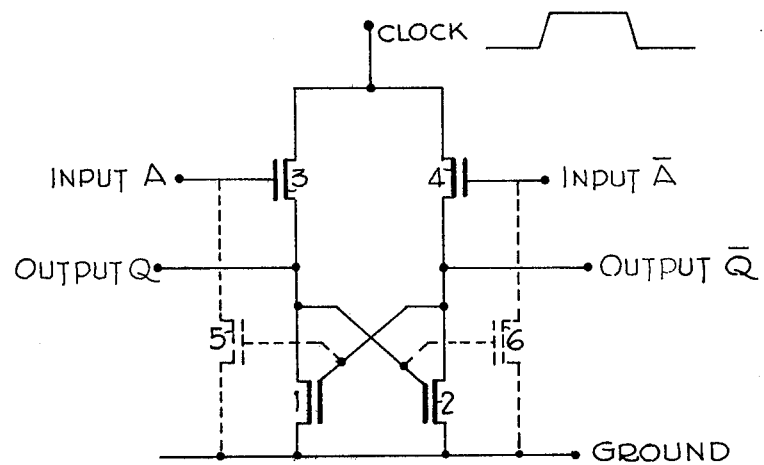
-Fig-1-
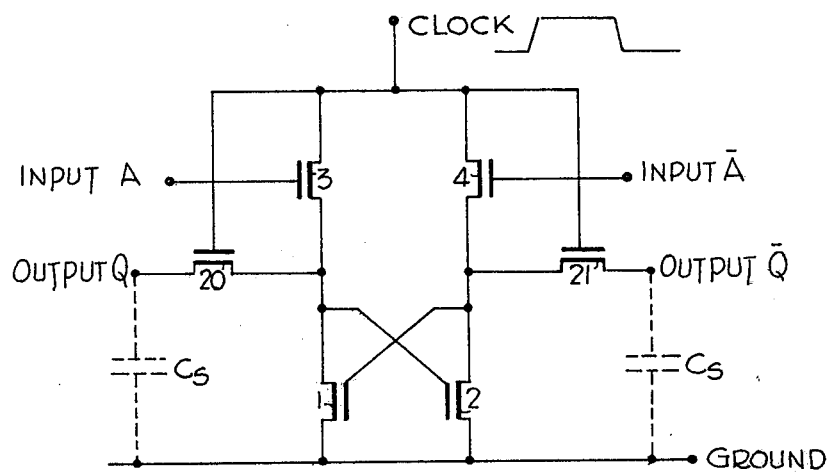
-Fig-2-

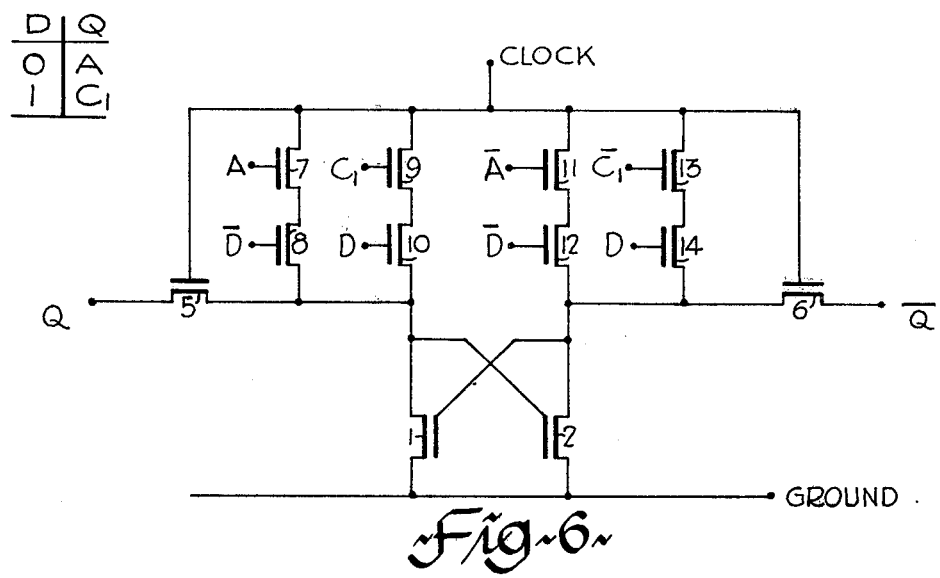
Fig-6
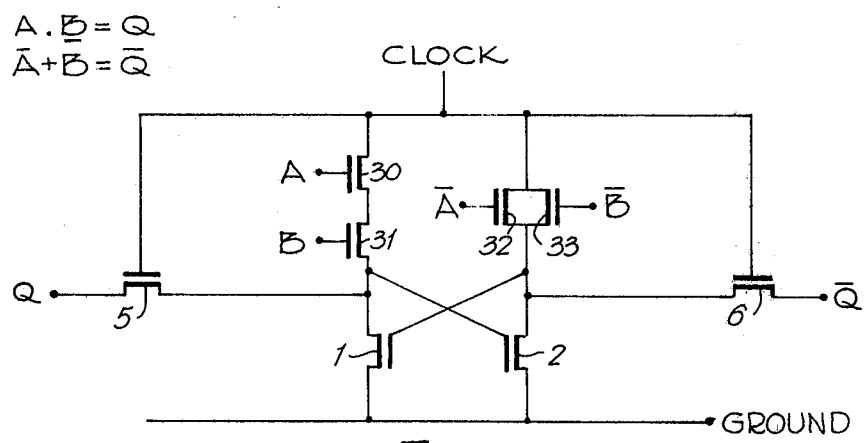
Fig-5
Fig-7

DYNAMIC LOGIC CIRCUITS OPERATING IN A DIFFERENTIAL MODE FOR ARRAY PROCESSING

This invention relates to logic circuits using active devices and, in particular, to MOS transistor logic circuits using dynamic logic which are differentially switched, that is, which switch in response to small differential input. The invention also relates to array processors using such circuits.

As is known, logic circuits can be classified as static or as dynamic. Static circuits are the basic combinational logic circuits, which perform logic, but have no memory. They exhibit time delays, (rise and fall time, etc.), but must be connected as flip-flops to perform sequential operations. Dynamic circuits are those which must work in a sequential mode. They are driven by clock power, rather than d.c. and the output can exist only for a defined and limited time. Of these classifications, dynamic circuits are more suitable for meeting the requirements of circuits such as high speed pipeline multipliers.

In this application the phrase "logic operation" is used to describe an operation in which output states are uniquely defined by two or more input states. The term "dynamic logic circuit" is used for a circuit which performs a logic operation under the control of clock pulses. An "arithmetic operation" is an operation in which numerical quantities form the elements of the calculation.

The term "differential logic signals" is used in regard to a system in which every occurrence of a logic signal is accompanied by an inverse signal, that is, complementary signals are always present. This is to be distinguished from the situation in which complementary devices, i.e., of opposite polarity, are employed. In the systems of this invention a signal and its complement are always required at the input of a particular circuit which always gives a signal and its complement as the output.

Circuits can also be classified as to technology, as bipolar or MOS. Bipolar circuits were the original logic circuits. RTL, DTL, TTL and a variety of ECLs have existed in integrated form since the early 1960s. These were augmented by Schottky TTL in the late 1960s and by I$^2$L. The latter are the most suitable for high-density LSI. The main application for bipolar circuits has been directed to the achievement of high-speed operation. With the possible exception of I$^2$L, it does not seem that these circuits will meet the high packing density requirements of high speed pipeline multipliers and other large scale integrated circuits used in digital data processing. Also, it is improbable that any of them will satisfy the power requirements. MOS circuits are those upon which most complex LSI is based. The technology allows large chips, with high packing densities. Thus, they are suitable for large and complex systems, such as microprocessors and RAMs. The original MOS circuits were based upon p-channel devices, but with improved process technology, n-channel circuits resulted in higher speed and higher density. Although dynamic circuits tended to be faster, static MOS generally predominates for logic. CMOS was the preferred route to high speed with low power and these circuits challenged TTL for SSI and MSI applications.

Dynamic MOS logic has several advantages from the circuit point of view, in that it allows fast circuits to be fabricated without the penalty of high power. It shares, with CMOS, the property of conducting current only when levels are changing. That is, current flows only to charge and discharge circuit capacitance. No current is required to maintain a state as with all static integrated circuits other than CMOS. However, the main distinctive property of dynamic logic is that it is synchronous and so can be implemented without the need for master-slave flip-flops. The temporary storage function of the master-slave combination is in the input capacitance of the active devices. The time constant of this capacitance is sufficient to store a logic state for several mS, a long time compared with most clocks used in data processing. This property makes it convenient and economical for pipe-lined logic and diagonally timed systems.

This invention relates to an array processor comprising a regular array of similar modules, each module consisting of dynamic circuits operating in a differential mode.

In a more specific aspect the invention relates to a logic circuit formed from input-controlled active devices having inherent reactive storage comprising: a first pair of devices connected as a cross-connected regenerative circuit; each device having at least one further device connected between it and a source of clock pulses; each further device being connected to receive an input signal from a set of differential logic signals; a second pair of devices connected to the source of clock pulses, selectively to isolate or couple the voltage levels across the input reactances of the first pair of devices to subsequent logic stages, whereby the device of the second pair connected to the higher voltage level is switched off by the falling clock pulse before the device connected to the lower voltage level.

In a still more specific aspect, the invention relates to a multiplier comprising a regular array of similar modules, each module having four inputs and four outputs; each input being adapted to be connected as an input port or to the output of a previous module in the data flow, each output being adapted to be connected as an output port or to the inputs of subsequent modules in the data flow; two sources of binary signals representing coefficients to be multiplied connected so that the digits of the signals are fed in parallel and with sequential timing to the input ports of the array; each module consisting of dynamic logic circuits operating in a differential mode and adapted to form a digit of the partial product of the coefficients and a carry signal, from digits of the previous partial product and the previous carry signal; whereby the output ports provide an output signal in parallel connection and with sequential timing.

Dynamic Differential Logic (DDL) is a particularly fast form of dynamic logic. Its use will become apparent from the following description of preferred embodiments of this invention. The embodiments use n-channel MOS transistors, because at present, n-channel devices have a significant speed advantage over p-channel devices. It is an advantage of the circuits of this invention that they use a single class of device (e.g. n-channel only) making them cheaper to process than CMOS and the faster device, of the two classes (n or p), can be chosen.

BRIEF DESCRIPTION OF THE DRAWINGS

FIG. 1 is a latch circuit;

FIG. 2 is a shift register stage using some of the principles of the invention;

FIG. 5 is the truth table for the circuit of FIGS. 3 and 4;

FIG. 6 is a modification of the circuit of FIG. 3 to act as a fast-carry gate;

FIG. 7 is an AND gate using the principles of the invention;

DESCRIPTION OF THE PREFERRED EMBODIMENTS

Figure 3:
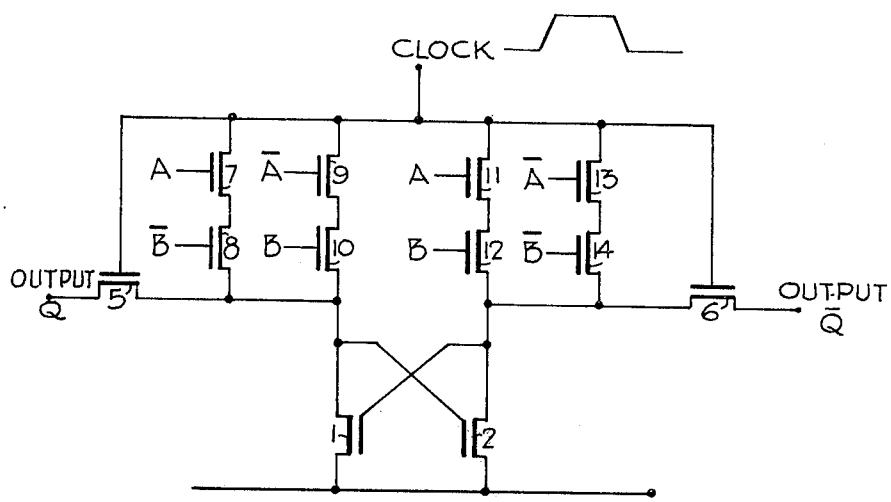
FIG. 3 is an exclusive OR gate using further principles of the invention.

The circuits of this invention are best understood by first referring to the load gated latch circuit of FIG. 1. Transistors 1 and 2 are cross-coupled, drain to gate, so that when a positive clock pulse is applied, via load transistors 3 and 4, the latch must take one of two stable states. Either transistor 1 conducts or transistor 2 conducts, with the conducting transistor preventing the other from conducting. The state, which the cross-coupled pair assumes, depends upon the relative conduction of the load transistors. If load 3 conducts a greater current than load 4, then the gate of transistor 2 is taken positive of the gate of transistor 1 and transistor 2 assumes the on state. Ideally, load 4 will not conduct at all. Then there is no path for dc from the clock input to ground.

This circuit can be used to detect small voltage differentials and two extra transistors, 5 and 6, (shown in broken lines) can be added to ensure that the less active load is switched off. It will be noted that these circuits contain no elements other than MOS transistors, with their parasitic resistances and capacitances. In this way the area, which is the cost of the circuit, is minimized.

When the latch circuit is used in Dynamic Differential Logic (DDL), the gates of loads 3 and 4 are precharged to the input states during one clock phase (say 1) and the latch is clocked on the next phase (say 2). The circuit is arranged so that the inputs become disconnected from their drive circuits during phase 2 so that they can float positive when the clock (and the appropriate loads) go positive. Now, a property of MOS transistors assists in the switching operation. Gate capacitance increases with gate to source voltage, but the stray capacitance to ground remains unchanged. Thus, the gate of a conducting device is taken positive more than the gate of the nonconducting device, reinforcing the direction of switching. The result is that the clock drives the appropriate output high (directly through its load transistor) with little delay (about 1nS).

A shift register can be constructed from a series of DDL latches, where one latch is used per stage and the temporary storage is provided by input capacitance. A single stage of this register is shown in FIG. 2. The circuit consists of the basic latch of FIG. 1, with the addition of series coupling transistors 20 and 21. These elements serve to charge the input capacitances (Cs) of the next stage and disconnect them at the end of the clock phase.

When the clock input voltage is at its maximum, one output will be close to this maximum and the other will be at ground, or close to ground. The gate electrodes of the series transistors, 20 and 21, will be at the clock voltage. Thus, the potential of the Cs at the high side will charge towards the output voltage level. The capacitance on the low side will be discharged to close to ground potential. When the clock potential descends below the stored potential on the high side Cs, its series transistor will be switched off and the charge will remain on the capacitance. The series transistor on the low side will not switch off until the clock potential is close to ground. Thus, the series device on the low side remains switched on for longer than that on the high side.

As the clock potential of the above mentioned stage descends, that of the next stage will start to rise. Now, view the circuit of FIG. 2 as representing this stage. Assume the input capacitance of load transistor 3 was charged high and 4 low. As the clock potential rises, the channel capacitance of device 3 causes its gate voltage to rise above the level to which it was charged. The low level input of device 4 remains clamped to ground. It is not until the switching action of transistors 1 and 2 has determined the final state of the latch, that the input of device 4 is unclamped.

Thus, the state of the first latch is transferred to the second. The first latch has no clock voltage and is inactive while its input capacitance is being precharged in anticipation of its next active phase. In this way, logic states are clocked along a chain of DDL latches.

The above mentioned shift register stage can be used to implement a variety of useful functions. It is also possible to combine the DDL latch with a variety of combinational logic circuits to perform most synchronous logic functions. The example that follows is of a synchronous exclusive OR gate.

The circuit of the exclusive OR gate is shown in FIG. 3. It consists of the circuit of FIG. 2, with one load transistor replaced by an exclusive OR combination (transistors 7, 8, 9 and 10) and the other by a corresponding array of devices performing a complementary logic function, namely an exclusive NOR (transistor 11, 12, 13 and 14). Note that:

$$A \oplus B = A \cdot \overline{B} + \overline{A} \cdot B \qquad \text{(left hand side)}$$

and $$\overline{A \oplus B} = A \cdot B + \overline{A} \cdot \overline{B} \qquad \text{(right hand side)}.$$

If the exclusive OR of A and B is true, the collector of transistor 1 will be latched positive, on the clock pulse and the Q output will go positive. If the relationship is false, the collector of transistor 2 will be latched positive and the $\overline{Q}$ output will go positive.

Figure 4:
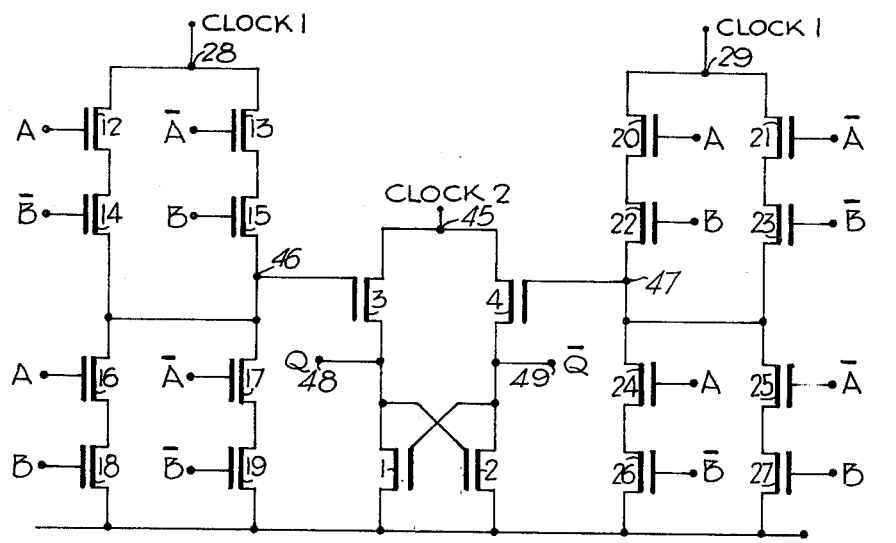
FIG. 4 is another embodiment of an exclusive OR gate.

An alternative form of exclusive OR gate is shown in FIG. 4. The inputs of the latch at the load elements, 3 and 4, are driven by complementary input gates. Note that these gates need not be complementary in device type (n or p), as in CMOS, but are complementary in function. That is, for a specific set of inputs, there is a group of circuit elements which gives a closed circuit for any group of elements giving an open circuit.

Referring again to FIG. 4, the circuit is timed as follows: Clock 1, which supplies the input gates, also supplies the dynamic latches of the driving stages (not shown). First, Clock 1 causes 28 and 29 to go positive and return to ground potential. Then, Clock 2 causes 45 to go positive and return to ground. The inputs are connected as indicated, where A and $\overline{A}$ are the differential outputs of a latch carrying data A, etc. The logic for the exclusive "OR" is given in FIG. 5. A=1 indicates that data at point A is positive and at point $\overline{A}$ is ground etc. When Clock 1 goes positive, point 46 will be taken positive if devices 12 and 14 conduct, or devices 13 and 15 conduct. If either of these cases is true, then neither 16 and 18 nor 17 and 19 will conduct. Similarly, either devices 24 and 26 or devices 25 and 27 will conduct, connecting point 47 to ground. Also, neither devices 20 and 22 nor devices 21 and 23 will conduct, so that Clock 1 cannot take point 47 positive. When Clock 2 goes positive, Q (point 48) will follow it while $\overline{Q}$ (point 49) will remain near ground potential. During the next Clock 1 cycle, new input data can cause different state of points 46 and 47 and new output states at points 48 and 49 on the next Clock 2 cycle.

FIGS. 6 and 7 show other forms of logic gates which are used in the multiplier described below. FIG. 6 is a fast-carry gate which is only a minor modification of the exclusive OR circuit of FIG. 3 by redefining the inputs. As can be seen from the logic table in FIG. 6, when D=1 the output Q=$C_1$ and when D=0 the outputs Q=A. This is a particular case of a multiplex circuit. A multiplex circuit is one wherein the output may be selected from one of several inputs under the control of a further input. Thus, in FIG. 6 the output Q can be $C_1$ or A as determined by input D. As with the other circuits previously discussed, complements of all quantities are present.

FIG. 7 shows the structure of an AND gate using the same principles of the invention. It will be seen that one load transistor is replaced by an AND series combination (transistors 30 and 31) and the other load transistor replaced by a corresponding array performing a complementary logic function, namely an OR parallel combination (transistors 32 and 33) so that the following complementary relationships are met:

$A \cdot B = Q$ $\overline{A} + \overline{B} = \overline{Q}$

It will be noted that a NAND output is available at the $\overline{Q}$ output. The circuit of FIG. 7 can also function as an OR gate by redefining the input signals with, again, a NOR output available at $\overline{Q}$.

Figure 11:
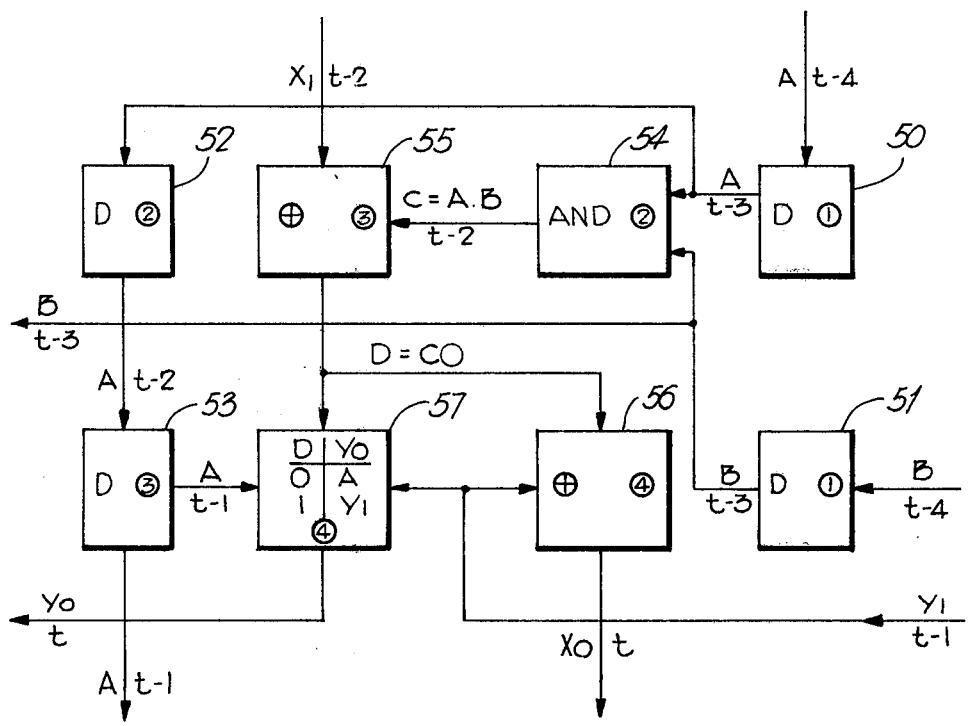
FIG. 11 is a schematic diagram of the module of FIG. 8, adapted for dynamic processing, using the basic circuits previously described.
Figure 12:
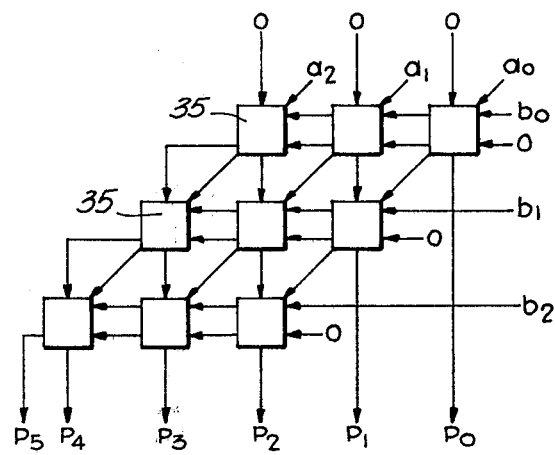
FIG. 12 shows the organization of an array multiplier using the circuits previously described.

It will be noted that signals (or their logical results) are clocked through successive stages of DDL on successive phases of Clocks 1 and 2. Thus, the timing requirements of a diagonally timed pipeline arithmetic unit, such as a multiplier can be realized by the appropriate interconnection of DDL gates. The modules of a modular diagonally timed multiplier are more complex than the logic gates described, but can be realized by an interconnection of simpler gates, timed in the same way. Such an array multiplier will now be described with respect to FIGS. 8-12. FIG. 12 shows a schematic diagram of such a multiplier with an array of identical modules 35. The principle of such a diagonally timed modular multiplier is described in the article "Digital Arithmetic Units For A High Data Rate" published in the Radio and Electronic Engineer, Volume 45, No. 3 in March, 1975. This is one example of what is known as fully pipelined dynamic logic circuits and is used as an illustration of the application of this invention.

Figure 8:
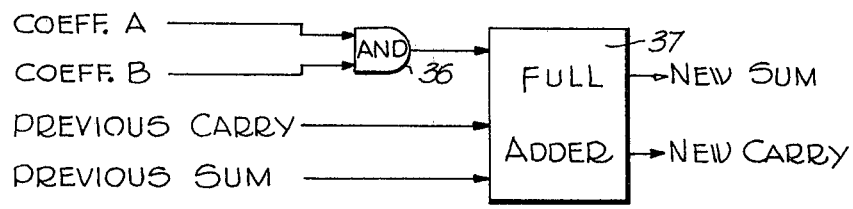
FIG. 8 is a schematic diagram of a basic module for an array multiplier.

The basic logic needed for a module, in such a multiplier, is first discussed in regard to FIG. 8. This module deals with the addition of a single binary digit to a single digit of a single partial product by connecting the coefficients to an AND gate 36 with the output connected to a full adder 37 also receiving the previous carry and previous sum signals. Both coefficient A and coefficient B are used by other modules in the multiplier array. Thus in the diagonally timed format they must be delayed and passed on to the appropriate module. This feature is shown in greater detail in FIG. 9 for the situation where a unit delay is allowed for the generation of the new sum and carry. Note that coefficient B must be delayed by network 38 to arrive at the next module at the same time as the new carry and coefficient A must be delayed by network 39 the time required for one carry plus one sum.

Figure 9:
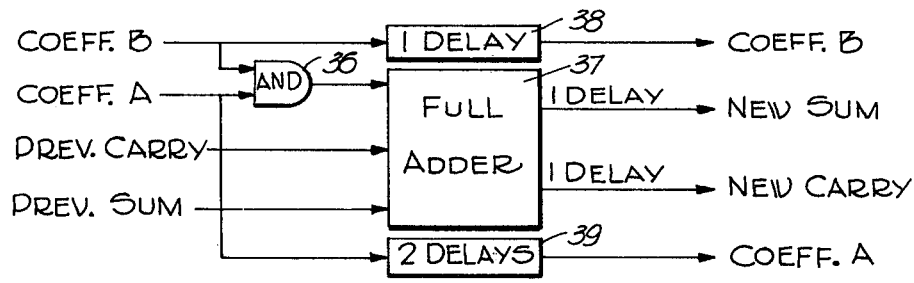
FIG. 9 is a schematic diagram of the module of FIG. 8 modified to provide the delays necessary for dynamic array processing.
Figure 10:
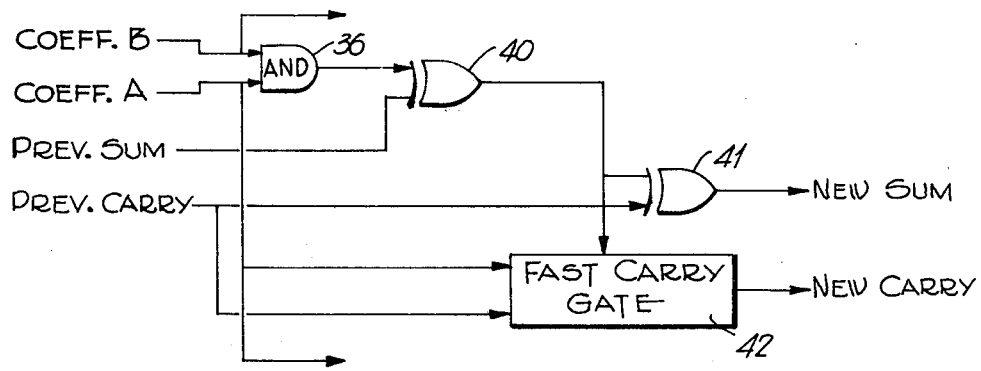
FIG. 10 is a schematic diagram of the module of FIG. 8 showing the full adder in greater detail.

Although it is possible to construct circuits to perform the full addition, in a single cycle, as suggested in FIGS. 8 and 9, it is convenient to subdivide the function into several simpler functions. For dynamic differential logic circuits this subdivision provides a further advantage, in that the clock speed increases with function simplification. If the maximum complexity permitted for any single logic gate is that of an exclusive OR, the logic for multiplication can be that shown in FIG. 10 using exclusive OR circuits 40 and 41. This circuit uses three gate delays between coefficient A and B and the outputs. Two delays are used between the previous sum and the outputs and one delay between the previous carry and the outputs. The fast carry gate 42 has been described in connection with FIG. 6. FIG. 11 shows the practical implementation of a multiplier module using the logic of FIG. 10 and the circuits described earlier in this disclosure. Elements 50–53 are simple delay (or shift register) units using a circuit of the type shown in FIG. 2. 54 is an AND gate and 55 and 56 exclusive OR gates. 57 is the fast carry gate.

This configuration fits the overall 16×16 bit multiplier very well. The total latency time is approximately thirty-two times the carry delay added to sixteen times the sum delay (each of which is two delays). This gives a latency of about 64 delay units, while keeping the unit delay as short as possible. If the instant at which the new sum and carry are produced is designated as t=0, then the input timing is as follows:

coefficient A, t=−4 delays;
coefficient B, t=−4 delays;
previous sum, t=−2 delays;
previous carry, t=−1 delay.

Figure 13:
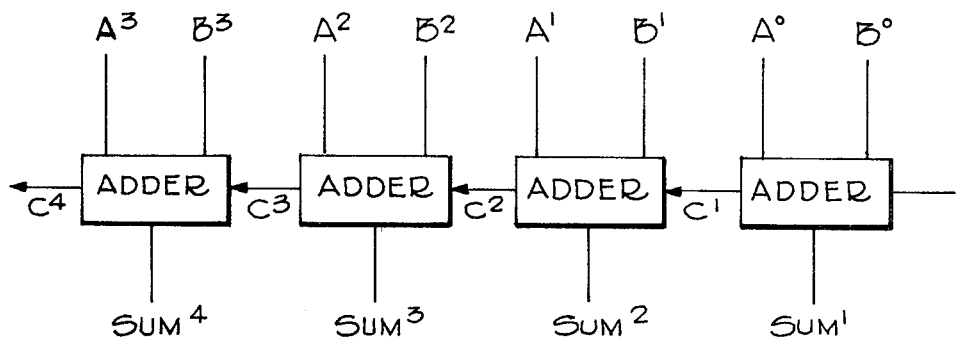
FIG. 13 is a schematic diagram of an adder array.
Figure 14:
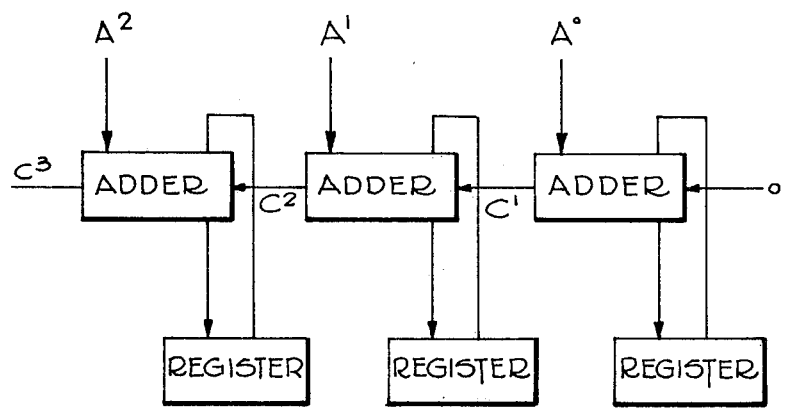
FIG. 14 is a schematic diagram of an accumulator.

Similar principles apply to array adders and accumulators. If a multiplier is considered as a two dimensional array, an adder or an accumulator is a one dimensional array. Both these one dimensional arrays can usefully employ the same timing stratagies as used in the multiplier. FIG. 13 shows a typical adder array consisting of the same type of 3-input adding module used in the multiplier of FIG. 12. Inputs $A^0$, $B^0$ and O are added first to produce a carry signal $C^1$ at the same time as inputs $A^1$ and $B^1$ are supplied to the next stage. The carry propagates at one delay per stage along to the most significant digit. Using dynamic differential logic, the least significant bits are entered on the first clock pulse, the first power on the second clock pulse and so on. Thus, the least significant bit of the sum is available first, followed by the first power on the next clock pulse and so on. FIG. 14 shows an accumulator formed from an adder and a register. The input number A is added to the number in the register. The timing sequence is similar to that for the adder of FIG. 13. Using dynamic differential logic, the register is the output reactance of the adder and a new least significant bit can be entered after one propagation delay for a single adder module.

Thus, there has been described novel logic circuits and novel array multiplier, adder and accumulator using such circuits. Although the particular embodiment described uses MOS transistors it will be clear that the inventive concept encompasses other active devices having inherent storage examples being bipolar transistors or Josephson junction devices. When reference is made to the use of the input capacitance or the inherent reactive storage of an active device for temporary storage, this is intended to encompass the use of minority carrier storage in bipolar transistors which produces an almost identical effect, although not strictly a reactive circuit.

We claim:

1. A logic circuit formed from input-controlled active devices having inherent reactive storage, comprising:
a first pair of devices, each having an input reactance, connected as a cross-connection regenerative circuit, one of said first pair of devices having a first array of devices performing a first logic function connected between said one of said first pair of devices and a source of clock pulses, and the other of said first pair of devices having a corresponding second array of devices performing a second logic function complementary to the first logic function and connected between said other of said first pair of devices and the source of clock pulses, each of said arrays of devices having inputs for receiving input signals from a set of differential logic signals; and
a second pair of devices connected to the source of clock pulses for selectively isolating or coupling the voltage levels across the input reactances of said first pair of devices to subsequent logic stages.

2. A logic circuit as set out in claim 1, wherein the inputs to said arrays of devices are arranged for the circuit to function as a multiplexer.

3. A logic circuit as set out in claim 1 wherein said logic circuit is connected to function as a fast carry gate for use in an adder or multiplier system having two coefficients to be added and a carry signal, wherein said first array has a first input connected to the carry signal, a second input connected to one of the coefficients, and a control input connected to an exclusive OR combination of the coefficients.

4. A logic circuit formed from input-controlled active devices having inherent reactive storage, comprising:
a first pair of devices, each having an input reactance, connected as a cross-connection regenerative circuit, one of said first pair of devices having a first array of devices performing a first logic function connected between said one of said first pair of devices and a source of clock pulses, and the other of said first pair of devices having a corresponding second array of devices performing a second logic function complementary to the first logic function and connected between said other of said first pair of devices and the source of clock pulses, each of said arrays of devices having inputs for receiving input signals from a set of differential logic signals; and
a second pair of devices connected to the source of clock pulses for selectively isolating or coupling the voltage levels across the input reactances of said first pair of devices to subsequent logic stages;
wherein said first array comprises an AND array, and said corresponding second array comprises an OR array, thereby forming an AND gate with a NAND output available from the other of said devices.

5. A logic circuit formed from input-controlled active devices having inherent reactive storage, comprising:
a first pair of devices, each having an input reactance, connected as a cross-connection regenerative circuit, one of said first pair of devices having a first array of devices performing a first logic function connected between said one of said first pair of devices and a source of clock pulses, and the other of said first pair of devices having a corresponding second array of devices performing a second logic function complementary to the first logic function and connected between said other of said first pair of devices and the source of clock pulses, each of said arrays of devices having inputs for receiving input signals from a set of differential logic signals; and
a second pair of devices connected to the source of clock pulses for selectively isolating or coupling the voltage levels across the input reactances of said first pair of devices to subsequent logic stages;
wherein said first array comprises an OR array, and said corresponding second array comprises an AND array, thereby forming an OR gate with a NOR output available from the other of said devices.

6. A logic circuit formed from input-controlled active devices having inherent reactive storage, comprising:
a first pair of devices, each having an input reactance, connected as a cross-connection regenerative circuit, one of said first pair of devices having a first array of devices performing a first logic function connected between said one of said first pair of devices and a source of clock pulses, and the other of said first pair of devices having a corresponding second array of devices performing a second logic function complementary to the first logic function and connected between said other of said first pair of devices and the source of clock pulses, each of said arrays of devices having inputs for receiving input signals from a set of differential logic signals; and
a second pair of devices connected to the source of clock pulses for selectively isolating or coupling the voltage levels across the input reactances of said first pair of devices to subsequent logic stages;
wherein said first array is an exclusive OR array and said corresponding second array is an exclusive NOR array.

7. A logic circuit as set out in claim 6 wherein said input-controlled active devices are transistors.

8. A logic circuit as set out in claim 7 wherein said transistors are MOS transistors with inherent electrode capacitance.

9. A logic stage formed from input-controlled active devices having inherent electrode capacitance, comprising:
a first pair of devices connected as a cross-coupled regenerative circuit;

each device having a further device connected between it and a source of clock pulses of a first phase, each said further device having an input reactance; and first and second sets of devices performing complementary logic functions energized by a source of clock pulses of a second phase and connected to receive input signals from a set of differential logic signals, each set of devices being connected to a different one of said further devices, whereby one such further device is selectively energized and the input reactance of the further device switched into conduction is much larger than the input reactance of the other further device.

10. A logic circuit as set out in claim 9 wherein said input-controlled active devices are transistors.

11. A logic circuit as set out in claim 10 wherein said transistors are MOS transistors with inherent electrode capacitance.

* * * * *